(12) United States Patent
Hosokawa et al.

(10) Patent No.: US 7,423,371 B2
(45) Date of Patent: *Sep. 9, 2008

(54) ORGANIC ELECTROLUMINESCENCE ELEMENT AND MANUFACTURING METHOD THEREOF

(75) Inventors: Chishio Hosokawa, Sodegaura (JP); Hisayuki Kawamura, Sodegaura (JP); Hiroaki Nakamura, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/272,069

(22) Filed: Nov. 14, 2005

(65) Prior Publication Data

US 2006/0066226 A1    Mar. 30, 2006

Related U.S. Application Data

(63) Continuation of application No. 11/024,729, filed on Dec. 30, 2004, now Pat. No. 6,998,773, which is a continuation of application No. 09/750,682, filed on Jan. 2, 2001, now Pat. No. 6,856,089, which is a continuation of application No. PCT/JP00/02796, filed on Apr. 27, 2000.

(30) Foreign Application Priority Data

Apr. 30, 1999    (JP)    ................. 11-124477

(51) Int. Cl.
H01J 1/62    (2006.01)
(52) U.S. Cl. ....................... 313/503; 313/512
(58) Field of Classification Search ......... 313/503–512; 428/690, 917
See application file for complete search history.

(56) References Cited

U.S. PATENT DOCUMENTS

| | | | |
|---|---|---|---|
| 4,814,668 A | | 3/1989 | Tohda et al. ................. 313/506 |
| 5,128,587 A | * | 7/1992 | Skotheim et al. ............ 313/504 |
| 5,229,628 A | * | 7/1993 | Kobayashi et al. .......... 313/509 |
| 5,399,936 A | | 3/1995 | Namiki et al. |
| 5,543,237 A | * | 8/1996 | Watanabe .................... 428/691 |
| 5,652,067 A | * | 7/1997 | Ito et al. ...................... 313/504 |
| 5,739,545 A | | 4/1998 | Guha et al. ................... 257/40 |
| 6,351,067 B2 | * | 2/2002 | Lee et al. ..................... 313/504 |
| 6,379,824 B1 | | 4/2002 | Hosokawa ................... 428/690 |
| 6,416,885 B1 | * | 7/2002 | Towns et al. ................ 428/690 |
| 6,525,466 B1 | | 2/2003 | Jabbour et al. .............. 313/504 |
| 6,555,403 B1 | | 4/2003 | Domen et al. ............... 438/22 |
| 6,563,527 B1 | | 5/2003 | Shimoda et al. ............. 347/240 |
| 6,856,089 B2 | | 2/2005 | Hosokawa et al. .......... 313/506 |
| 6,998,773 B2 | * | 2/2006 | Hosokawa et al. .......... 313/506 |

FOREIGN PATENT DOCUMENTS

EP    0 888 035 A1    12/1998

(Continued)

*Primary Examiner*—Peter Macchiarolo
(74) *Attorney, Agent, or Firm*—Steptoe & Johnson LLP

(57) ABSTRACT

An organic electroluminescence element and manufacturing method thereof including an anode, semiconductor layer, organic light-emitting medium, and a cathode, wherein an organic light-emitting medium is located between the first electrode and the semiconductor layer including the non-monocrystal material and the second electrode is electrically connected to the edge section of the semiconductor layer when either one of the anode or cathode is designated as first electrode and the other electrode as second electrode. Because the first electrode and the second electrode are configured not to be opposite to each other, various electrode materials can be used, and the light-emitting area can be increased, and therefore, the organic EL element with the luminous energy emitted to the outside and a manufacturing method thereof can efficiently obtain such an organic EL element.

7 Claims, 9 Drawing Sheets

FOREIGN PATENT DOCUMENTS

| | | |
|---|---|---|
| EP | 0 891 122 A1 | 1/1999 |
| EP | 0 901 176 A2 | 3/1999 |
| EP | 0 903 964 A1 | 3/1999 |
| EP | 0 955 791 A1 | 11/1999 |
| EP | 1 182 910 A1 | 2/2002 |
| GB | 2 331 183 A | 5/1999 |
| JP | 60-12696 | 1/1985 |
| JP | 4-14215 | 1/1992 |
| JP | 2000-91083 | 3/2000 |
| JP | 2000-91083 | 9/2000 |
| WO | 97/34447 | 9/1997 |
| WO | 97/47050 | 12/1997 |
| WO | WO 9747050 A1 * | 12/1997 |
| WO | WO 99/20080 A | 4/1999 |
| WO | WO 00/60907 A | 10/2000 |

* cited by examiner

ORGANIC ELECTROLUMINESCENCE ELEMENT AND MANUFACTURING METHOD THEREOF

CROSS REFERENCE TO RELATED APPLICATION

This application is a continuation of application Ser. No. 11/024,729 filed Dec. 30, 2004, now U.S. Pat. No. 6,998,773, which is a continuation of application Ser. No. 09/750,682, filed Jan. 2, 2001 now U.S. Pat. No. 6,856,089, issued Feb. 15, 2005, which is a continuation of PCT/JP00/02796, filed Apr. 27, 2000, which claims priority under 35 USC 119 of Japanese Application No. 11-124477, filed Apr. 30, 1999.

BACKGROUND OF THE INVENTION

1. Field of Invention

The present invention relates to an organic electroluminescence element (hereinafter sometimes called the "organic EL element" or "EL element") and the manufacturing method thereof.

Particularly, the present invention relates to an organic EL element which has a large light-emitting area suited for non-commercial and industrial-use display devices (liquid displays and the like) and which can be used for various electrode materials and to the manufacturing method that can obtain such organic EL elements efficiently.

2. Description of Related Art

One example of the conventional organic EL element is disclosed in, for example, JP-A-3-262170. Referring now to FIG. 13, the configuration is explained. An organic layer 202 is interposed between a first electrode 201 and a second electrode 203 and at least the first layer 201 is composed with inorganic semiconductor material, namely, monocrystal semiconductor materials such as GaP, GaAlAs, GaAsP, ZnS, and the like.

When the first electrode 201 is of an n-type semiconductor, the joined surface of the first electrode 201 and the organic layer 202 is made by electron injection joining the first electrode 201 to the organic layer 202, that is, electron injection is achieved by tunnel effects.

In addition, when the first electrode 201 is of the p-type semiconductor, the joined surface of the first electrode 201 and the organic layer 202 is made by hole injection joining from the first electrode 201 to the organic layer 202, where the hole injection is carried out by the tunnel effects.

Incidentally, in FIG. 13, the first electrode 201 is represented by symbol "P", the organic layer 202 is represented by symbol "O", and the second electrode 203 is represented by symbol "M".

However, the organic EL element disclosed in JP-A-3-262170 has the first electrode 201 which is opposed to the second electrode 203 as shown in FIG. 13, and EL emission light is omitted from either of the electrodes 201 or 203. Consequently, with regard to the light transmittance of the electrode, there are problems in that the electrode material is limited to transparent material, such as indium tin oxide (ITO) or the blue light is difficult to be effectively obtained from the electrodes 201, 203.

Furthermore, the electrodes 201, 203 are composed with monocrystal semiconductor material in these organic EL elements, there is a big restriction in manufacturing. More concretely, since making such monocrystal semiconductor material is not easy, it is difficult to produce an organic EL element with a large area.

Consequently, in JP-A-8-180974 and JP-A-11-31590, or WO97/34447, as shown in FIG. 14, an auxiliary electrode 213 is provided in part of the electrode 212 and the low resistance is obtained as a whole electrode.

However, as electrodes are opposed each other in all inorganic EL electrodes or organic EL elements, the transparent materials such as ITO must be used for the electrode to transmit light effectively.

Therefore, the inventors of the present invention diligently have investigated the above-mentioned problems and found out that the conventional problems could be solved by installing an organic light-emitting medium between either an anodic or cathodic electrode (first electrode) and a semiconductor layer comprising non-monocrystal material and electrically connecting the other electrode (second electrode) to the edge section of the semiconductor layer.

Accordingly, it is an object of the present invention to provide an organic EL element that can be used for a wide variety of electrode materials and that has a large area, as well as to provide a manufacturing method that can obtain such organic EL element efficiently.

SUMMARY OF THE INVENTION

One of the embodiments according to the present invention relates to an organic EL element comprising an anode, a semiconductor layer, an organic light-emitting medium, and a cathode, characterized in that an organic light-emitting medium is located between the first electrode and the semiconductor layer comprising the non-monocrystal material and the second electrode is electrically connected to the edge section of the semiconductor layer when either one of the anode or cathode is designated as the first electrode and the other electrode as the second electrode.

Because the first electrode and the second electrode are not substantially opposite to each other by configuring such organic EL element, there is no restriction to the materials used for these electrodes because the consideration of the light emitted is not needed. Consequently, low-resistance opaque materials can be used for each electrode.

In addition, because the electrode is made from the non-monocrystal materials, a large-area organic EL element can be also obtained.

Furthermore, because the second electrode does not serve as a barrier material even when the light is emitted from the semiconductor layer to the outside, the light energy volume that is emitted can be increased.

In configuring the organic EL element according to the present invention, it is preferable that the second electrode is electrically connected to the extended section extended in the horizontal direction from the edge section of the semiconductor layer.

By configuring in this way, the electrically connected section between the second electrode and the semiconductor layer can be made into a big area and can stabilize the connection resistance, and can prevent short-circuit between the second electrode and the organic light-emitting medium.

By the way, as described later, in the horizontally extended section of the semiconductor layer, the second electrode may be formed at the position that achieves the same level as that of the organic light-emitting medium, or a recessed section is formed at the horizontally extended section on which the second electrode may be formed.

In configuring the organic EL element according to the present invention, it is preferable for the second electrode to be electrically connected to two or more edge sections of the semiconductor layer.

By configuring in this way, it is possible to make the electrically connected section between the second electrode and the semiconductor layer into a large area, and even if one electrically connected section fails, conductivity is able to be secured by other electrically connected sections.

In configuring the organic EL element according to the present invention, it is preferable for the second electrode to be made in patterns of lattices or combs.

By configuring in this way, the organic light-emitting medium is allowed to emit light uniformly and the light energy which is emitted is increased at the same time.

In addition, in configuring the organic EL element according to the present invention, it is preferable that the non-monocrystal material is one of the chalcogenide materials selected from a group consisting of ZnS, ZnSe, CdS, CdTe, ZnTe, MgS, MgSe, ZnSSe, ZnMgSSe, ZnCdSSe, and ZnTeSe.

By configuring the semiconductor layer with these non-monocrystal materials, it is able to easily achieve a large area. In addition, if the semiconductor layer comprises these non-monocrystal materials, the light energy that can be emitted may be increased.

In addition, in configuring the organic EL element according to the present invention, it is preferable that the non-monocrystal material is at least one of the metal oxide non-degenerate semiconductors selected from a group consisting of Al, Sn, Zn, In, Cd, Mg, and Si.

By configuring the semiconductor layer with these non-monocrystal materials, large area can be easily obtained. In addition, if the semiconductor layer comprises these non-monocrystal materials, the light energy that can be emitted may be increased.

In configuring the organic EL element according to the present invention, it is preferable that the non-monocrystal material is either amorphous carbon or diamond-like carbon.

By configuring the semiconductor layer with this kind of non-monocrystal materials, a large area can be easily obtained.

In configuring the organic EL element according to the present invention, it is preferable that the non-monocrystal material is a conductive conjugate polymer, a polymer containing an oxidizing agent, a polymer containing a reducing agent, a low-molecular weight compound containing an oxidizing agent, or a low-molecular weight compound containing a reducing agent.

By configuring in this way, an increased area may be easily achieved and a semiconductor layer with excellent surface smoothness may be formed, and element defects can be reduced.

In configuring the organic EL element according to the present invention, it is preferable that the band gap of the semiconductor layer is held to 2.7 eV or higher.

By configuring in this way, it is possible to improve the transparency of the semiconductor layer, the EL light energy emitted can be increased.

In configuring the organic EL element according to the present invention, it is preferable that the thickness of the semiconductor layer is held within 1-700 nm.

By configuring in this way, the specified intensity may be obtained and at the same time, the transparency of the semiconductor layer can be improved, and the EL light energy emitted can be increased.

In configuring the organic EL element according to the present invention, it is preferable that the specific resistance of the semiconductor layer is held within the range of $1\times10^{-3}$ to $1\times10^{4}$ Ωcm.

By configuring in this way, the driving voltage of the organic EL element can be lowered further and at the same time, the luminance in the light-emitting surface can be homogenized.

In configuring the organic EL element according to the present invention, it is preferable that the electric charge concentration of the semiconductor layer is held within the range of $1\times10^{12}$ to $1\times10^{20}$ cm$^{-3}$.

By configuring in this way, the driving voltage of the organic EL element can be lowered and at the same time, the quenching under the exciting condition in the organic light emitting medium may be prevented.

In configuring the organic EL element according to the present invention, it is preferable that the light transmittance of the semiconductor layer is held to 10% or more.

By configuring in this way, the EL light energy emitted can be increased.

The light transmittance of the semiconductor layer has effects on the wavelength of the transmitting light, and in general, even when the light transmittance is about 10% but when it is the light with smaller energy (wavelength) than the band gap of the semiconductor layer, it is known that the light transmittance of, for example, greater than 80% can be easily obtained.

In configuring the organic EL element according to the present invention, it is preferable that an electric insulation section is located between the second electrode and the organic light-emitting medium.

By configuring in this way, short-circuits between the second electrode and the organic light-emitting medium and cross-talk of the display screen can be definitely prevented.

In configuring the organic EL element according to the present invention, it is preferable to configure in such a manner that the EL light is emitted from the semiconductor layer.

By configuring in this way, it becomes possible to use various electrode materials in the first electrode.

In configuring the organic EL element according to the present invention, it is preferable that the conductive layer is interposed between the second electrode and the semiconductor layer.

By configuring in this way, it becomes possible to lower the connection resistance between the second electrode and the semiconductor layer, and furthermore it becomes possible to easily inject electrons and holes.

In configuring the organic EL element according to the present invention, it is preferable that an auxiliary electrode is provided for the second electrode.

By configuring in this way, it becomes possible to further lower the resistance of the second electrode and to drive the organic EL element at low voltage.

The other embodiment of the present embodiment is a manufacturing method of the organic EL element including the anode, semiconductor layer, organic light-emitting medium, and the cathode, comprising a step for forming the second electrode, a step for forming a semiconductor layer at the position where the second electrode is able to be electrically connected to the edge section of the semiconductor layer using the non-monocrystal material, a step for forming the organic light-emitting medium, a step for forming the first electrode, when either of the anode or cathode is called the first electrode and the other electrode the second electrode.

In addition, it is preferable to include in the manufacturing method a step for patterning in the step for forming the second electrode.

By implementing in this way, the organic EL element is able to allow the organic EL element to emit the light in the specified pattern, and when a plurality of patterns is possessed, each of them can be emitted electrically independently.

In this way, the contact area between the second electrode and the semiconductor layer can be increased, and the low-voltage drive of the organic EL element is ensured.

In implementing the method for manufacturing the organic EL element according to the present invention, it is preferable to include a step for forming the electric insulation film for covering the second electrode, or a step for forming the non-injection type semiconductor layer or metal layer.

By configuring in this way, the second electrode may be mechanically and chemically protected, and furthermore, short-circuits can be prevented and the injection of holes or electrons from the second electrode can be prevented.

DETAILED DESCRIPTION OF THE PREFERRED EMBODIMENT

Figure 1:
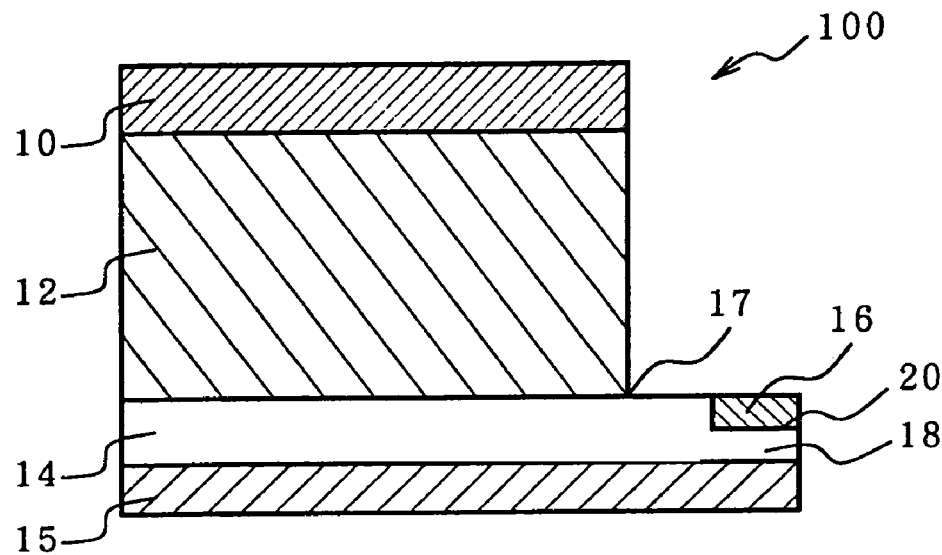
FIG. 1 is a cross-sectional view describing the construction of the organic EL element in the first embodiment.

Referring now to drawings, embodiments according to the present invention will be described specifically as follows. The drawings referred here only generally show the size, profile, and arrangement relations of each component member to understand the present invention. Consequently, this invention should not be limited to the illustrated examples. In the drawings, there are cases in that hatching that indicates the cross section may be omitted.

First Embodiment

Referring now to FIG. 1, the first embodiment according to the present invention will be described. FIG. 1 is a cross-sectional view of an organic EL element in the first embodiment, wherein on the support substrate 15, a semiconductor layer 14 comprising non-monocrystal material, an organic light-emitting medium 12, and a cathode (first cathode) 10 are formed successively. Anode (second electrode) 16 is electrically connected to the extension 18 extended in the horizontal section from the edge section 17 of the semiconductor layer 14.

Consequently, as the light may be emitted from the semiconductor layer 14 by configuring in this way, the light energy (or light intensity) can be increased. In addition, since the anode (second electrode) 16 and the cathode (first electrode) are not practically opposite to each other, a wide variety of electrode materials may be used and the electrical connection to the outside is facilitated. In addition, since the semiconductor layer 14 is composed with the non-monocrystal material, a semiconductor layer 14 of a large area may be formed. Consequently, because it is possible to form the organic light-emitting medium 12, and the like on the semiconductor layer 14, as a result, an organic EL element 100 of a large area can be configured.

(1) Organic Light-Emitting Medium (i) Composing Material

The organic light-emitting material used for the composing material of the organic light-emitting layer preferably provides the following three functions in combination.

(a) Electric charge injection function: A function for injecting electrons from the cathode or the electron injection layer while holes are able to be injected from the anode or hole injecting layer when the electrical field is applied.

(b) Transportation function: A function for moving injected holes and electrons by the force of the electrical field.

(c) Light-emitting function: A function for providing a field for re-combining electrons with holes and for allowing these to emit light.

However, it is not always necessary for the organic-light emitting material to have all of the functions of (a) to (c) above, and for example, there are suitable ones as organic light-emitting materials of those whose hole injection transportability is far better than the electron injection transportability. Consequently, the materials that promote the electron transportation in the organic light-emitting layer where electrons can recombine with holes in the vicinity of the center of the organic light-emitting layer can be suitably used.

Now, in order to improve the recombination capabilities in the organic light-emitting layer, the electron mobility of the organic light-emitting material is preferably set to $1\times10^{-7}$ $cm^2/V\ s$ or higher. The reason is when it becomes less than $1\times10^{-7}\ cm^2/V\ s$, the high-speed response in the organic EL element may become diminished or the light-emitting luminance may be lowered.

Consequently, the electron mobility of the organic light-emitting material is preferably set to a value within the range of $1.1\times10^{-7}$ to $2\times10^{-3}\ cm^2/V\ s$ and is more suitably set to a value within the range of $1.2\times10^{-7}$ to $1\times10^{-3}\ cm^2\ V\ s$ In addition, it is preferable that the electron mobility is smaller than the hole mobility of the organic light-emitting material in the organic light-emitting layer. This is because if the electron mobility is larger than the hole mobility of the organic light emitting material, the organic light-emitting material used for the organic light-emitting layer may be excessively limited and the light-emitting luminance may be lowered.

On the other hand, the electron mobility of the organic light-emitting material is preferably greater than 1/1000 times as much as the hole mobility. This is because when the electron mobility becomes excessively small, it becomes difficult for the electron to recombine with the hole in the vicinity of the center of the organic light-emitting layer, and as a result, the light-emitting luminance may be lowered.

Consequently, the hole mobility ($\mu_h$) and the electron mobility ($\mu_e$) of the organic light-emitting material in the organic light-emitting layer preferably satisfy the relation of $\mu_h/2 > \mu_e > \mu_h/500$, and more suitably satisfy the relation of $\mu_h/3 > \mu_e > \mu_h/100$.

In the first embodiment, it is preferable to use aromatic cyclic compounds with a styryl group expressed by the following equations (1) to (3).

The use of this kind of aromatic cyclic compounds with a styryl group can easily satisfy the conditions of electron mobility and hole mobility of the organic light-emitting material in the organic light-emitting layer described above.

In the general formula (1), $Ar^1$ denotes the aromatic group with the number of carbons ranging from 6 to 50, $Ar^2$, $Ar^3$, and $Ar^4$ are aromatic groups with the number of carbons ranging from 6 to 50 or a hydrogen atom, at least one of $Ar^1$, $Ar^2$, $Ar^3$, and $Ar^4$ is the aromatic group, and the number of condensation n is an integer from 1 to 6.

In the general formula (2), $Ar^5$ denotes the aromatic group with the number of carbons ranging from 6 to 50, $Ar^6$ and $Ar^7$ are a hydrogen atom aromatic groups with the number of carbons ranging from 6 to 50 which may be replaced, and the number of condensation m is an integer from 1 to 6.

In the general formula (3), $Ar^8$ and $Ar^{14}$ denote the aromatic group with the number of carbons ranging from 6 to 50, $Ar^9$ through $Ar^{13}$ are a hydrogen atom or aromatic groups with the number of carbons ranging from 6 to 50 which may be replaced, and the numbers of condensation p, q, r, s are 0 or 1, respectively.

Now, for the aromatic group, examples of allyl group with the number of nuclear atoms ranging from 5 to 40 include phenyl, naphthyl, anthranil, phenanthryl, pyrenyl, coronyl, biphenyl, terphenyl, pyrrolyl, furanyl, thiophenyl, benzothiophenyl, oxadiazoril, diphenylanthranil, indolyl, carbazolyl, pyridyl, benzoquinolil, dibenzochrysenilene, and the like.

Examples of preferable allylene group with the number of nuclear atoms ranging from 5 to 40 include phenylene, naphthylene, anthranilene, phenanthrylene, pyrenylene, coronylene, bipheylene, terphenylene, pyrrolylene, furanylene, thiophenylene, benzothiopheylene, oxadiazorilene, diphenylanthranilene, indolylene, carbanzolylene, pyridylene, benzoquinolilene, dibenzochryenilene, and the like.

These aromatic groups may be further replaced by different substitutes. Examples of preferable substitutes include alkyl group with the number of carbons from 1 to 6 (or an ethyl group, a methyl group, an i-propyl group, a n-propyl group, a s-butyl group, a t-butyl group, a pentyl group, a hexyl group, a cyclohexyl group, and the like), an alkoxy group with the number of carbons from 1 to 6 (or an ethoxyl group, a methoxyl group, an i-propoxy group, a n-propoxy group, a s-butoxy group, a t-butoxy group, a pentoxy group, a hexyloxy group, a cyclopentoxy group, a cyclohexyloxy group, and the like), an aryl group radical of the number of nuclear atoms of 5 to 40, an amino group substituted with an aryl radical with the number of nuclear atoms of 5 to 40, an ester group with an aryl radical of number of nuclear atoms ranging from 5 to 40, an ester group with an alkyl group of number of carbons of 1 to 6, a cyano group, a nitro group, and a halogen atom.

It is also preferable to use benzothiazole-based compounds, benzoimidazole-based compounds, benzooxyazole-based compounds, and other fluorescent brighteners compounds, styrylbenzene-based compounds, metal complexes with 8-quinolinol derivative as a ligand in combination.

It is also suitable to use the material in combination, in which the organic light-emitting material of distyryl allylene skeleton, for example, 4,4'-bis(2,2-diphenylvinyl) biphenyl, and the like is used as a host and the strong fluorescent pigments from blue to red, for example, coumarin-based fluorescent pigments or pigments similar to the host, is doped in the host.

(ii) Forming Method

Next the method for forming the organic light-emitting layer is described. This kind of forming method is not particularly limited, but, for example, a vacuum deposition method, a spin-coating method, a casting method, a LB (Langmuir-Blodgett) method, a sputtering method, and the like may be used. For example, in the case of forming by the vacuum deposition method, it is preferable to adopt the conditions of 50-450° C. for deposition temperature, in an inert gas, $1 \times 10^{-7}$ to $1 \times 10^{-3}$ Pa for vacuum, 0.01 to 50 nm/sec. for film forming rate, and 50 to 300° C. for substrate temperature.

In addition, it is possible to form the organic light-emitting layer by dissolving binder resins and organic light-emitting materials in a solvent to achieve the solution condition, and then forming the solution into thin film by a spin-coating method, and the like. Now, the preferable binder is a transparent resin, and examples of the particularly preferable binder include polycarbonate, polystyrene, polyolefin, polyimide, polysulfone, and the like.

(iii) Film Thickness

There is no particular limitation to the film thickness of an organic light-emitting layer, and any film thickness may be chosen as required in accordance with conditions, but specifically, it is preferable that the film thickness is within the range of 5 nm to 5 µm. This is because when the film thickness of the organic light-emitting layer becomes less than 5 nm, the light-emitting luminance or durability may be lowered, whereas when the film thickness of the organic light emitting layer exceeds 5 µm, the value of voltage applied may be increased.

Consequently, because better balance is achieved between the light-emitting luminance and applied voltage value it is more preferable to keep the film thickness of the organic light-emitting layer between 10 nm and 3 µm, and more suitably between 20 nm and 1 µm.

(2) Semiconductor Layer (i) Component Material

For the component material of the semiconductor layer, any material may be used except monocrystal materials. Generally, it is desirable to use the following chalcogenide materials, non-degenerate metal oxide semiconductors and organic semiconductor materials. By configuring the semiconductor layer with such organic semiconductor materials, a large area can be easily obtained. In the case of the semiconductor layer configured with these non-monocrystal materials, the transparency is high and the light energy can be increased when the light is emitted from the semiconductor layer to the outside.

To be more specific, for chalcogenide materials, at least one material chosen from a group consisting of ZnS, ZnSe, CdS, CdTe, ZnTe, MgS, MgSe, ZnSSe, ZnMgSSe, ZnCdSSe, and ZnTeSe can be mentioned.

When these chalcogenide materials are ZnSSe ternary system chalcogenide materials, a mixed composition can be obtained within the range expressed by $ZnS_xSe_y$ (x+y=1; $0 \leq x \leq 1$, $0 \leq y \leq 1$). When the chalcogenide materials are ZrMgSSe quaternary system chalcogenide materials, a mixed composition can be obtained within the range expressed by $Zn_pMg_gS_xSe_y$ (p+g=1, $0 \leq p \leq 1$, $0 \leq g \leq 1$, x+y=1, $0 \leq x \leq 1$, $0 \leq y \leq 1$)

In addition, it is also preferable to dope the chalcogenide material with acceptor materials and donor materials to reduce the resistance of a semiconductor layer. An acceptor material referred to here is a compound added to produce the holes in the semiconductor layer, while a donor material is a compound added to produce electrons in the semiconductor layer. To be more specific, it is preferable to dope the semiconductor layer with acceptor materials and donor materials such as Li, Cu, Na, Ag, N, F, and the like.

The amount these acceptor materials and donor materials added is not particularly limited, but specifically, it is preferable to achieve the value within the range of 0.01 to 5 mol %. The reason is that as the added amount is less than 0.01 mol %, the adding effects may not be manifested, while as such added amount exceeds 5 mol %, the materials coagulate and it becomes difficult to form a homogenous semiconductor layer. Consequently, it is more suitable to keep the amount of acceptor materials and donor materials within the range between 0.1 and 2 mol %.

Examples of non-degenerate semiconductor of metal oxides include Al, Sn, Zn, In, Cd, Mg, and Si.

The non-degenerate semiconductor (electric charge concentration: less than $1 \times 10^{20}$ cm$^{-3}$) is, in general, used in the ternary or quaternary system, but by controlling the concentration of the dopant or the oxygen void, or controlling the composition ratio, it can be brought into the value within the preferable ranges of electric charge concentration and specific resistance value. For example, a combination of $SnO_2$ and Al is generally used for a degenerate semiconductor, but by adding Al as donor impurities by 3-10 at. %, it can be made into a non-degenerate semiconductor. Furthermore, InZnO is generally used as a degenerate semiconductor, but by adding Si, Mg, Al as impurities by 1 to 20 at. %, it can be made into a non-degenerate semiconductor.

One of the preferable organic semiconductor materials is amorphous carbon or diamond carbon.

These organic semiconductor materials may further contain hydrogen atoms or it is preferable to add boron, phosphor, or other acceptor materials or donor materials to make p-type or n-type semiconductor materials.

In configuring the organic EL element according to the present invention, the non-monocrystal material is preferably a conductive conjugate polymer, a polymer containing an oxidizing agent, a polymer containing a reducing agent, a low-molecular weight compound containing an oxidizing agent, or a low-molecular weight compound containing a reducing agent.

For this kind of a conductive conjugate polymer, polyaniline and its derivatives, polythiophene and its derivatives (see JP-A-8-48858 and JP-A-7-90060), for the polymer or low-molecular weight compound to which the oxidizing agent is added, polymers containing aryl amine or thiophene oligomer in the main chain or the side chain can be used. For the polymer or a low-molecular weight compound to which the reducing agent is added, the compounds having a nitrogen heterocyclic group are available.

Examples of an oxidizing agent added to polymers and a low-molecular weight compounds include Lewis acid, for example, iron chloride, antimony chloride, aluminum chloride, and the like. Similarly, examples of a reducing agent added to polymers and a low-molecular weight compounds include alkaline earth metal, rare earth metals, alkali compounds, alkali earth compounds, rare earth compounds, and the like. Furthermore, in these compounds, the organic complex (the ligand is an organic material) of alkali metals or alkali earth metals mentioned above are included.

(ii) Properties of the Semiconductor Layer

Because the light may be effectively emitted from the semiconductor layer, the light transmittance of the semiconductor layer is preferably 10% or higher, more preferably 50% or higher, and more suitably 70% or higher.

Because the value of light-emitting luminance of the semiconductor layer may be increased, the band gap (energy gap) is preferably 2.7 eV or greater.

The reason is that by making the band gap greater than 2.7 eV, excellent electron barrier effects or hole barrier effects are able to be obtained, and with this, electrons or holes have less chances to pass over the organic light-emitting medium and move to the semiconductor layer. Consequently, the recombination efficiency of holes and electrons is improved, and the luminance of the organic EL element can be increased.

The electric charge concentration in the semiconductor layer is preferably kept to the range from $1 \times 10^{12}$ to $1 \times 10^{20}$ cm$^{-3}$.

The reason is that when the electric charge concentration of the semiconductor layer becomes less than $1 \times 10^{12}$ cm$^{-3}$, the drive voltage becomes remarkably high and light luminance may become non-uniform, while when the electric charge concentration of the semiconductor layer becomes higher than $1 \times 10^{20}$ cm$^{-3}$, the metal-like property of the semiconductor layer occurs and the excited condition generated in the organic light-emitting medium may be likely to be quenched.

Consequently, the electric charge concentration of the semiconductor layer is preferably kept to the range from $1 \times 10^{13}$ to $1 \times 10^{19}$ cm$^{-3}$ and more suitably to the range from $1 \times 10^{14}$ to $1 \times 10^{18}$ cm$^{-3}$.

In addition, the specific resistance of the semiconductor layer is preferably held to the range from $1 \times 10^{-3}$ to $1 \times 10^{9}$ Ωcm. This is because when the specific resistance of the semiconductor layer becomes less than $1 \times 10^{-3}$ Ωcm, the metal-like property occurs, and the excited condition generated in the organic light-emitting medium may be likely to be quenched, while when the specific resistance of the semiconductor layer becomes higher than $1 \times 10^{9}$ Ωcm, the drive voltage may become excessively high.

However, f when organic EL element pixels of typical size (for example, 300 μm×300 μm) are formed and driven by direct current, the specific resistance of the semiconductor layer is more preferably held to the range from $1 \times 10^{-3}$ to $1 \times 10^{5}$ Ωcm. By keeping the specific resistance of the semiconductor layer to this range, still more uniform luminescence may be obtained.

When organic EL pixels element of the typical size are formed and driven by alternating current, the specific resistance of the semiconductor layer is more preferably held to the range from $1 \times 10^{-3}$ to $1 \times 10^{4}$ Ωcm. By keeping the specific resistance of the semiconductor layer to this range, larger current may be passed in a specified time in accordance with the duty ratio.

(iii) Film Thickness

It is preferable that the film thickness of the semiconductor layer be a value within the range from 1 to 700 nm. The reason is that when the film thickness of the semiconductor layer is less than 1 nm, the continuous film can not be obtained, while when the film thickness of the semiconductor layer is more than 700 nm, the light emission efficiency may be lowered.

Consequently, the film thickness of the semiconductor layer is more preferably between 5 and 500 nm and more suitably between 10 and 300 nm.

(3) Electrode

According to the present invention, the anode and the cathode are not practically opposite to each other and the light is able to be emitted from the semiconductor layer, the restrictions placed on the electrodes (for example, from the viewpoint of light transmittance), can be remarkably reduced. In the present invention, either one of these anode and cathode is designated as the first electrode and the other as the second electrode. Consequently, it is possible to designate the first electrode as the anode and the second electrode as the cathode, or the first electrode as the cathode and the second electrode as the anode.

Examples of the materials used for the electrodes are enumerated, but various kinds of metals and electrically conductive compounds may be used for the second electrode if the injection to the semiconductor layer is able to be successfully carried out.

However, when holes or electrons are injected from the anode or the cathode as the second electrode, these electric charges pass the electrically connected edge portions of the semiconductor layer and move to the semiconductor layer with a larger area, and consequently, the composition material of the second electrode should be selected, considering the connection resistance at the relevant electrically connected portions of the semiconductor layer.

(i) Anode

For the anode, it is preferable to use metal, alloy, electrically conductive compound or these mixtures with a large work function (for example, 4.0 eV or more). Specifically, indium tin oxide (ITO), indium zinc oxide (IZO), zinc oxide, gold, platinum, palladium, and the like can be used independently in one kind or in two or more kinds in combination.

The film thickness of the anode is not particularly limited, but it is preferably between 10 and 1,000 nm and more suitably between 10 and 200 nm.

(ii) Cathode

On the other hand, for the cathode, it is preferable to use metal, alloy, electrically conductive compound or these mixtures with a small work function (for example, less than 4.0 eV). Specifically, magnesium, aluminum, indium, lithium, sodium, silver, tungsten, tantalum-tungsten alloy, titanium, chromium, aluminum-tungsten alloy, aluminum-titanium alloy, and the like can be used independently in one kind or in two or more kinds in the combination.

The film thickness of the cathode is not particularly limited, either, but it is preferably between 10 and 1,000 nm and more suitably between 10 and 200 nm.

(iii) Electrode Position

Referring now to FIGS. 1 to 11, the location of the second electrode and the connection structure when the anode or the cathode is designated as the second electrode is shown where the second electrode is electrically connected to the edge section of the semiconductor layer. The electrical connection referred to here is the connection that enables electrical conduction by connecting or bringing either anode or cathode to or in contact with the semiconductor layer. Consequently, the contact resistance should be brought preferably to 1 kΩ or lower, and more suitably to 100Ω or lower.

However, the location and connection structure of the second electrode in the present invention should not be limited to the locations indicated in FIGS. 1 to 11, and may be a combination of these structures, and the like as required, and any location that enables electrical connection with the edge section of the semiconductor layer is acceptable.

FIG. 1 indicates the location of the second electrode 16 in the organic EL element 100 of the first embodiment, and a recessed section 20 is provided in the extension 18 extended in the horizontal direction from the edge section 17 of the semiconductor layer 14, and an anode (second electrode) 16 is formed in this recessed section 20.

Forming the second electrode 16 at this kind of position makes it possible to bring the electrically connected section between the second electrode 16 and the semiconductor layer 14 in a large area, prevents occurrence of short-circuiting, and in addition, facilitates the electrical connection with the outside. Furthermore, forming the second electrode 16 at this kind of position aligns the top surface of the second electrode 16 to the top surface of the semiconductor layer 14 to be flat, and makes it possible to easily to carry out the treatment such as insulation, and the like.

Figure 2:
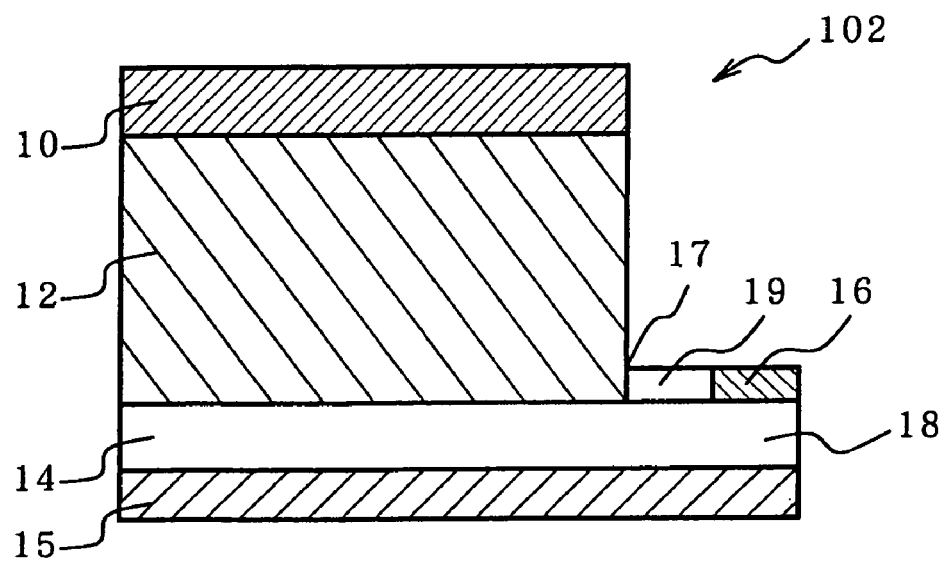
FIG. 2 is a cross-sectional view for describing the construction of the organic EL element in the modified example of the first embodiment (No. 1).

FIG. 2 shows the location of the second electrode 16 in the organic EL element 102 of the modification example (No. 1) of the first embodiment, and an anode (second electrode) 16 is formed on the surface of an extension 18 which is extended in the horizontal direction from the edge section 17 of the semiconductor layer 14. Forming the second electrode 16 at this kind of location can make the electrically connected section between the second electrode 16 and the semiconductor layer 14 larger. Furthermore, since the distance between the second electrode 16 and the organic light-emitting medium 12 can be made longer, occurrence of short-circuiting is able to be effectively prevented. Furthermore, because the first electrode 10 and the second electrode 16 are aligned in the same direction and the top surface direction is exposed in FIG. 2, electrical connection with the outside is easier.

Figure 3:
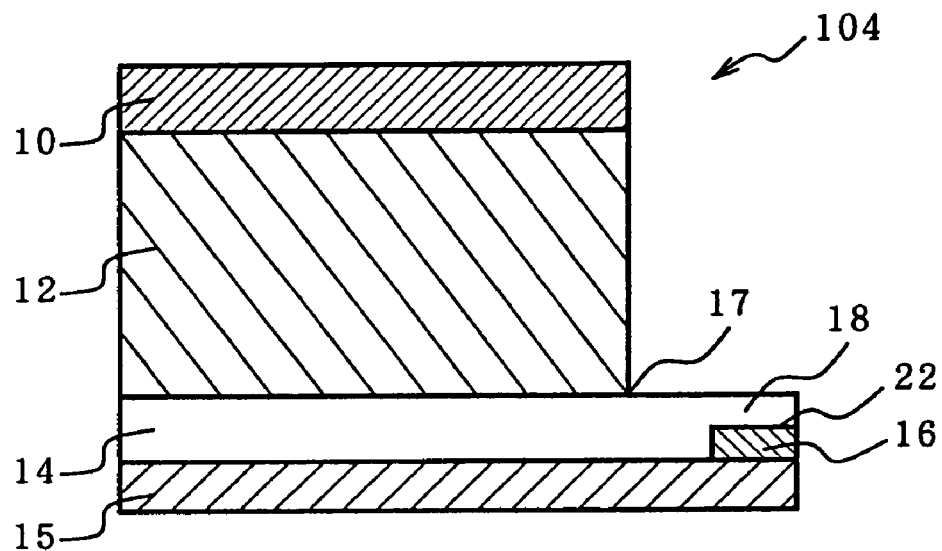
FIG. 3 is a cross-sectional view for describing the construction of the organic EL element in the modified example of the first embodiment (No. 2).

FIG. 3 shows the location of the second electrode 16 in the organic EL element 104 of the modified example (No. 2) of the first embodiment, in which there is the extension 18 extended in the horizontal direction from the edge section 17 of the semiconductor layer 14, and the second electrode 16 is formed on the side opposite to the side where the organic light-emitting medium 12 is located.

Forming the second electrode 16 at this kind of location can make the electrically connected section between the second electrode 16 and the semiconductor layer 14 larger, and occurrence of short-circuits is able to be effectively prevented between the second electrode and the organic light-emitting medium 12 without providing electrical insulation treatment. In this example, as shown in FIG. 1, an recessed section 22 is provided in the extension 18, in which the second electrode 16 is formed.

Figure 4:
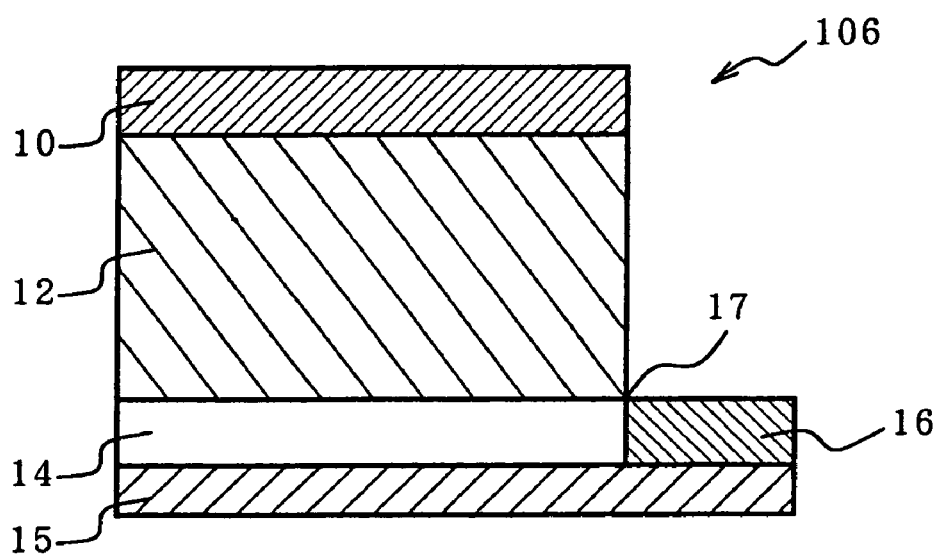
FIG. 4 is a cross-sectional view for describing the construction of the organic EL element in the modified example of the first embodiment (No. 3).

FIG. 4 shows the location of the second electrode 16 in the organic EL element 106 of the modified example (No. 3) of the first embodiment. It shows that the second electrode 16 is formed directly adjacent to the edge section (side end) 17 of the semiconductor layer.

Forming the second electrode 16 at this kind of location provides a lateral configuration of the organic EL element 106.

Figure 5:
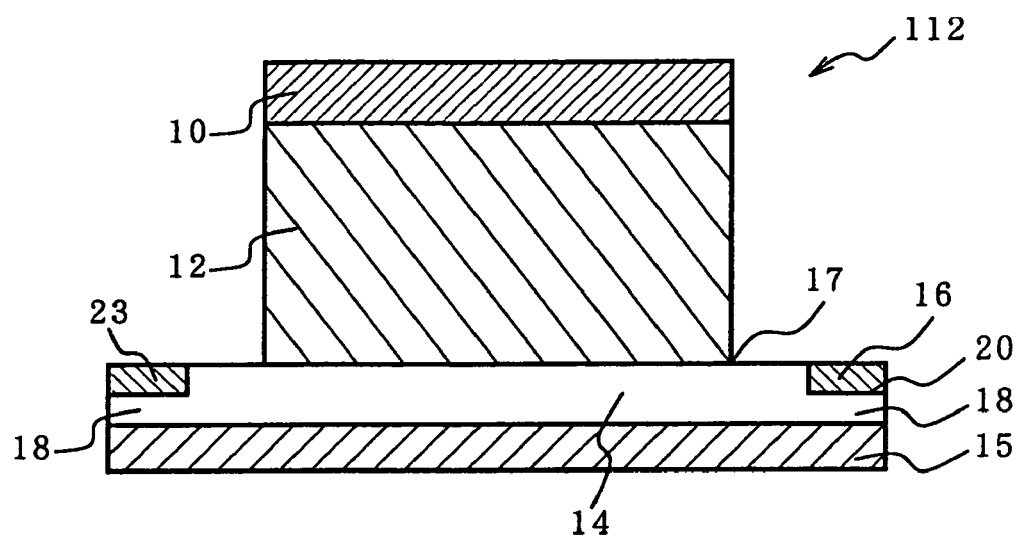
FIG. 5 is a cross-sectional view for describing the construction of the organic EL element in the modified example of the first embodiment (No. 4).

FIG. 5 shows a modification example (No. 4) of the first embodiment, and shows an example in which the second electrodes 16, 23 are provided in two places in the organic EL elements 112. That is, it indicates that the second electrodes 16, 23 are formed via the extension 18 to the edge section (side end) 17 on both sides of the semiconductor layer 14.

Forming a plurality of second electrodes 16, 23 in this way can increase the contact area of these second electrodes 16, 23 with the extension 18 in the semiconductor layer 14, facilitating the injection of electrons and holes. Even when continuity failure occurs between either of the two electrodes 16, 23 and the extension 18 in the semiconductor layer 14, continuity with the other extended section 18 in the semiconductor layer 14 can be maintained with the other second electrode 16, 23.

Figure 6:
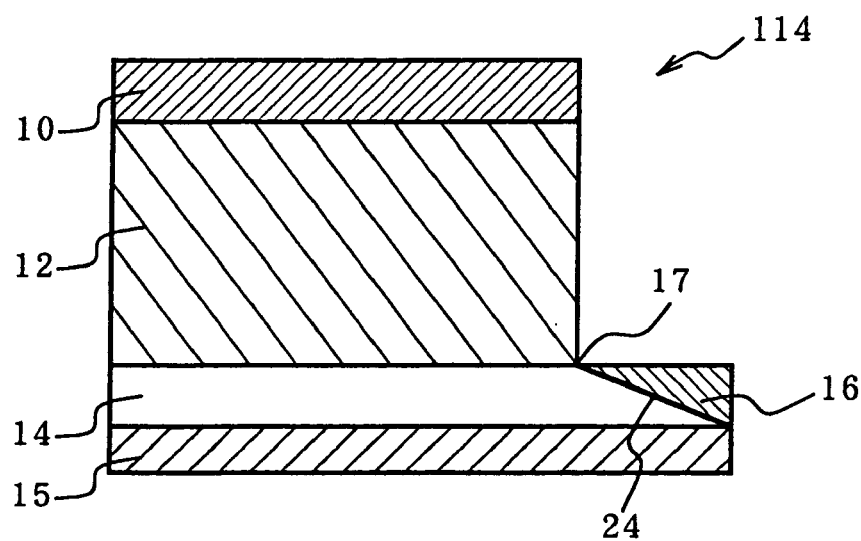
FIG. 6 is a cross-sectional view for describing the construction of the organic EL element in the modified example of the first embodiment (No. 5).

FIG. 6 shows a modified example (No. 5) of the first embodiment, in which a taper 24 is formed at the edge section of the semiconductor layer 14, and on the taper, the second electrode 16 is formed.

Forming the semiconductor layer 14 and the second electrode 16 in the form of taper in this way can make the contact area larger and facilitate injection of electrons and holes.

In the modified example (No. 5) of the first embodiment, the taper 24 is formed descending in the right in FIG. 6, but conversely, this may be formed ascending in the right. In the modified example (No. 5) of the first embodiment, the cross-sectional profile in the taper 24 is formed in a triangle in FIG. 6, but this cross-sectional profile may be a trapezoid.

Figure 7:
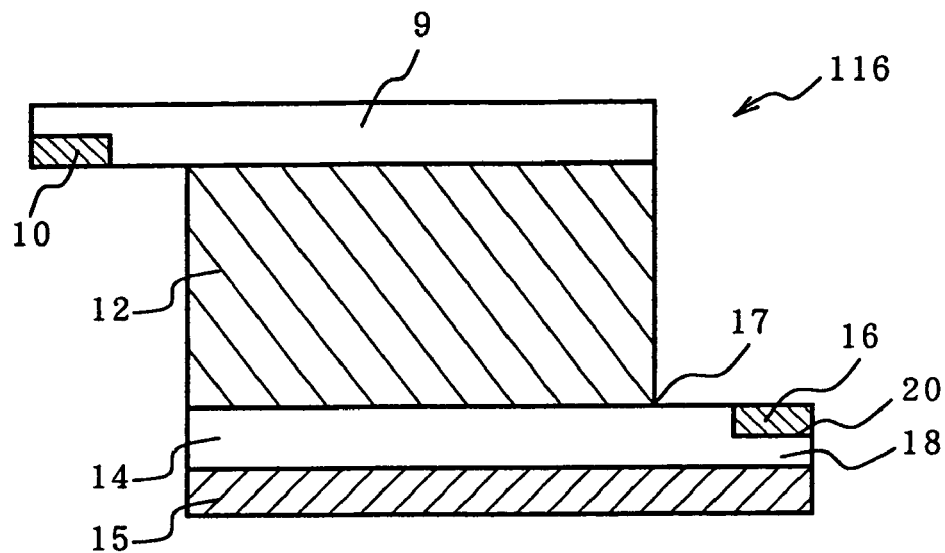
FIG. 7 is a cross-sectional view for describing the construction of the organic EL element in the modified example of the first embodiment (No. 6).

FIG. 7 shows a modified example (No. 6) of the first embodiment, in which the semiconductor layer 9 is provided on the first electrode 10 side. That is, it shows that the first electrode 10 is formed at the edge section on the side end of the semiconductor layer 9.

Forming the first electrode 10 in this way reduces the restrictions on the kinds of materials used in the first electrode, and since opaque low-resistance material may be used, injection of electrons and holes becomes easier.

Figure 8:
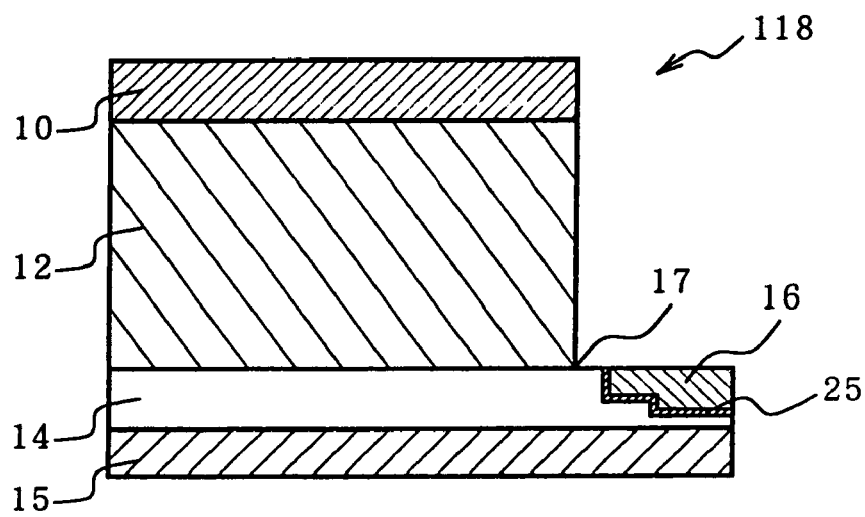
FIG. 8 is a cross-sectional view for describing the construction of the organic EL element in the modified example of the first embodiment (No. 7).

FIG. 8 shows the modified example (No. 7) of the first embodiment, in which steps are formed at the edge section of the semiconductor layer 14, and on the step, the conductive layer 25 is formed, and on the conductive layer 25, the second electrode 16 is formed.

Bringing the semiconductor layer 14 to the second electrode in the form of steps and further forming the conductive layer 25 can increase the contact area and facilitates the lowering of resistance.

Figure 9:
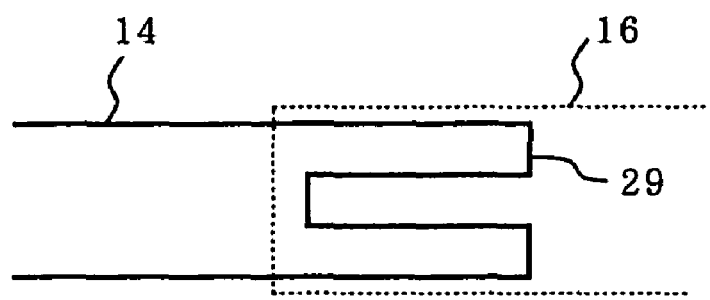
FIG. 9 is a drawing for describing the connection structure between the second electrode and the semiconductor layer (No. 1).
Figure 9:
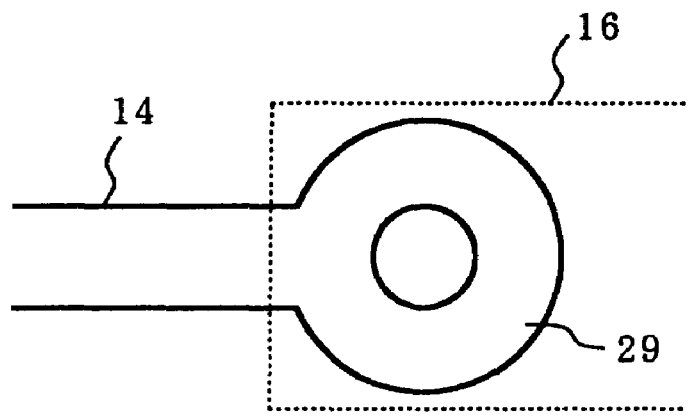
Figure 9:
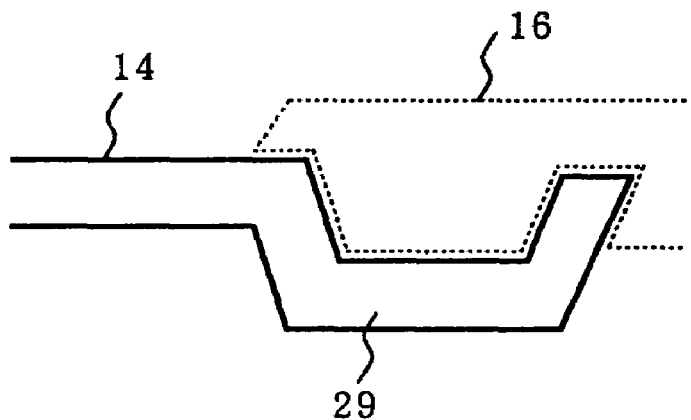
Figure 9:
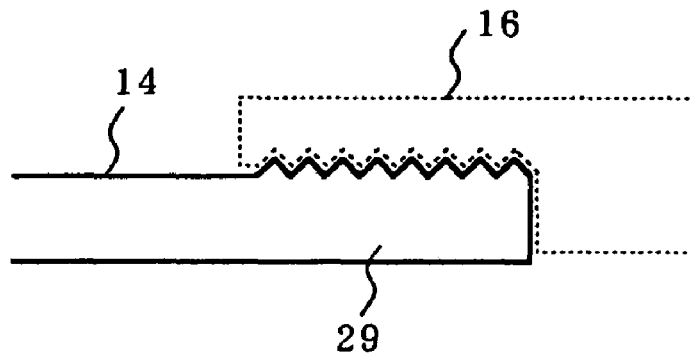

FIG. 9 shows the connection condition and connection position of the semiconductor layer 14 and the second electrode 16. FIGS. 9(a) and (b) show plans, while FIGS. 9(c) and (d) show cross-sectional views.

This is preferable because taking this kind of form can increase the contact area and because the excellent connection reliability is obtained, the head end section of the semiconductor layer 14 can be split as shown in FIG. 9(a) or the head end section of the semiconductor layer 14 can be made into a hole structure as shown in FIG. 9(b).

For the same reasons, it is preferable that as shown in FIG. 9(c), a recessed section is provided at the head end section of the semiconductor layer 14 or a triangle is formed at the head end section of the semiconductor layer 14 as shown in FIG. 9(d).

Figure 10:
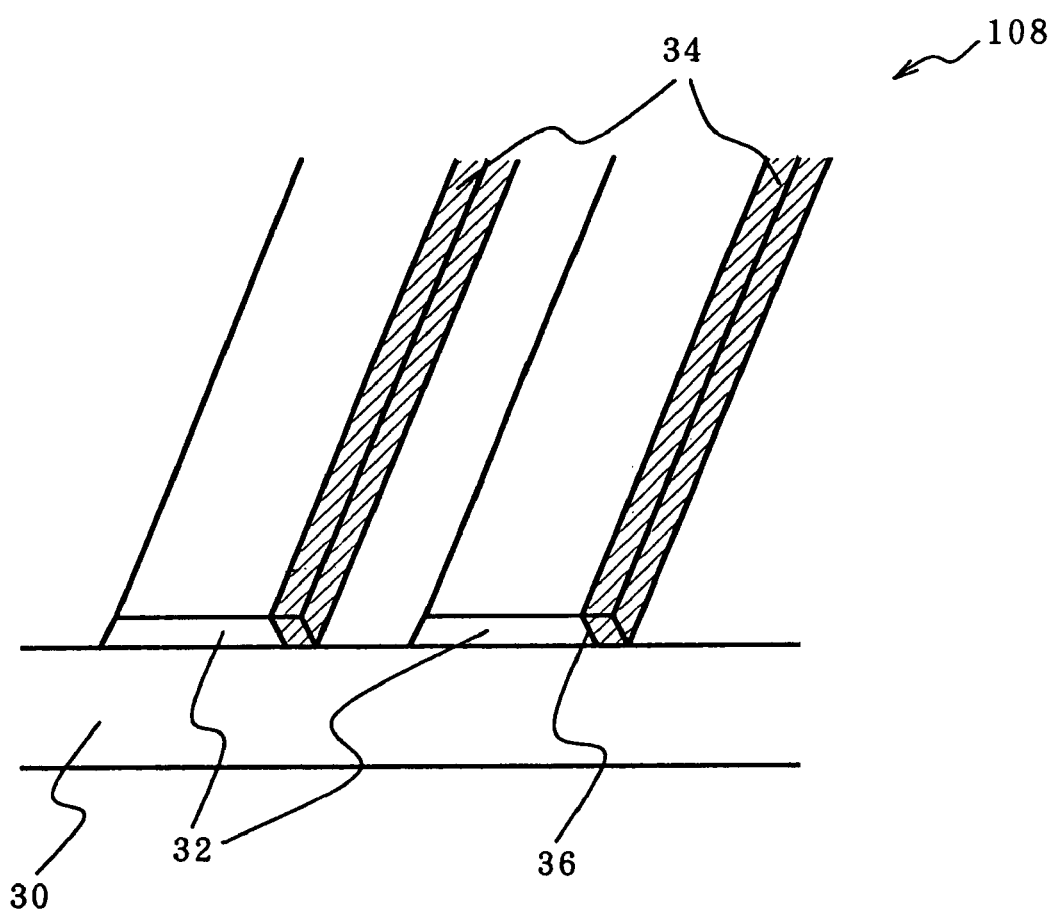
FIG. 10 is a drawing for describing the connection structure between the second electrode and the semiconductor layer (No. 2).

FIG. 10 shows the location of the second electrode 34 in the organic EL element 108 of the modified example (No. 8) of the first embodiment, indicating the configuration with the organic light-emitting medium, the first electrode, and the like omitted. In this example, a plurality of second electrodes 34 are patterned and installed in the form of stripes. In addition, a plurality of semiconductor layers 32 are patterned and installed along the second electrode 34. And the second electrode 34 is electrically connected along the edge section (side end) 36 of the semiconductor layer 32.

Consequently, forming the second electrode 34 in this kind of location can effectively prevent voltage drop by the resistance at the semiconductor layer 32 (not illustrated) by applying voltage across the first electrode (not illustrated) and the second electrode 34.

When the second electrode 34 is formed at this location, for example, when the first electrode is arranged vertically to the second electrode 34, the organic EL element (pixels) 108 can be arranged in a matrix form. Consequently, a large volume of the light energy can be emitted from the light-emitting surface of the large-area semiconductor layer 32, and at the same time, a thin-type display device can be presented.

Figure 11:
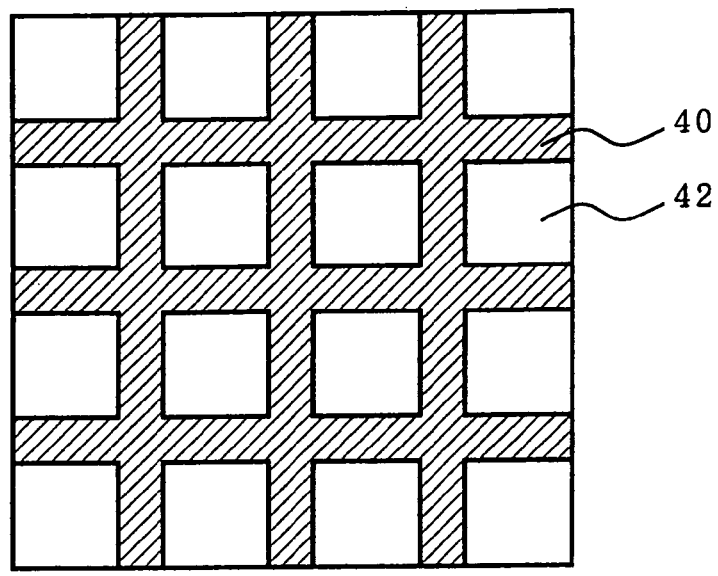
FIG. 11 is a drawing for describing the connection structure between the second electrode and the semiconductor layer (No. 3).
Figure 11:
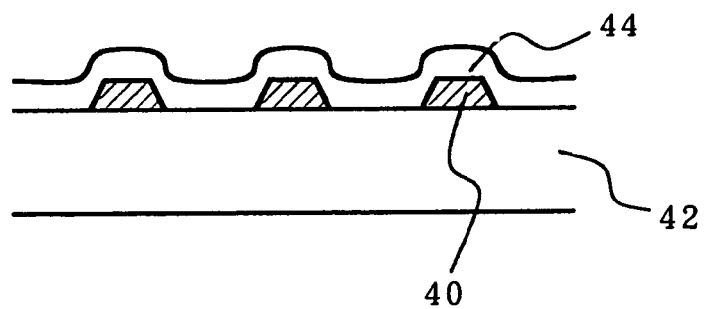
Figure 11:
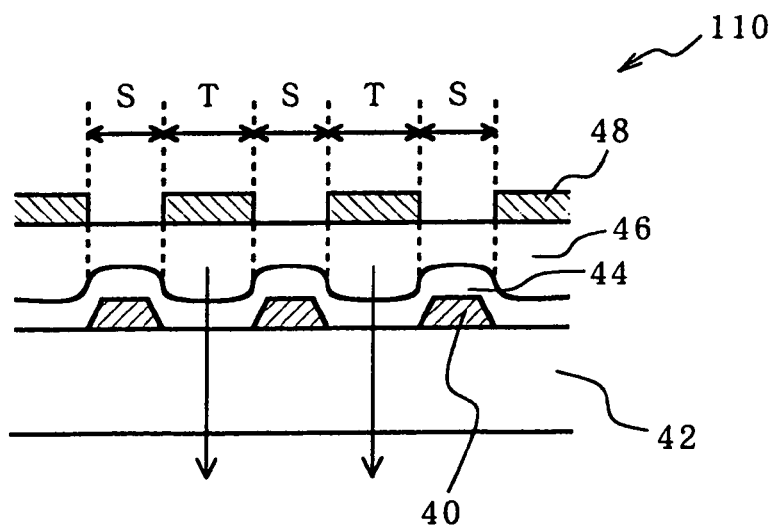

FIG. 11 shows the position of the second electrode 40 in the organic EL element 110 of the modified example (No. 9) of the first embodiment. FIG. 11(a) indicates that the second electrode 40 is patterned in the form of lattices on the support substrate 42 when viewed from above, and FIG. 11(b) indicates that the semiconductor layer 44 is installed as if it covers the second electrode 40 and partly exposed support substrate 42 when viewed in cross-section. Furthermore, FIG. 11(c) shows cross-sectionally that in the organic EL element 110 in which the organic light-emitting medium 46 is formed on the semiconductor layer 44 shown in FIG. 11 (b), and patterned first electrode 48 is in turn formed above organic light-emitting medium 46, the light is emitted from the section shown with symbol "T".

Consequently, forming the second electrode 40 in this kind of location provides an electrically connected section between the second electrode 40 and the semiconductor layer 22 having a large area, and the voltage drop caused by the resistance at the semiconductor layer can be effectively prevented. In addition, forming the second electrode 40 in this kind of location, the organic EL element (pixels) 110 can be arranged in a matrix by the positional relationship with the first electrode (not illustrated) And a large volume of light may be emitted from the light-emitting surface of the large-area semiconductor layer 44.

The second electrode may be included in one pixel and the above-mentioned configuration may be included in the semiconductor layer. Furthermore, the configuration shown in FIG. 11 may be two-dimensionally arranged as dots (part of the pixel) and may be formed in a matrix.

(4) Support Substrate

Next, support substrate 15 in the organic EL element is discussed. A support substrate that provides excellent mechanical strength and low permeability of moisture and oxygen can be used. Specifically, for example, glass substrates, ceramic substrates, and the like 100 to 2,000 μm thick can be.

When the light is emitted via the semiconductor layer formed on the support substrate, the light transmittance of the relevant support substrate is preferably 90% or more, and suitably 93% or more, and more preferably 98% or more.

(5) Configuration Examples

The organic EL element of the first embodiment has the anode designated as the second electrode and the cathode as the first electrode, and virtually has the configuration of (i), but taking the configurations of the organic EL element of (ii) through (iv) is preferable by combining other component elements, such as hole injection layer or electron injection layer.

It is also preferable to take the configurations (v) through (viii) of the organic EL element with the anode designated to the first electrode and the cathode to the second electrode.

The preferable configuration examples (i) to (Viii) of the organic EL element is specifically indicated as follows:

(i) Substrate/semiconductor layer (+anode (second electrode))/organic light-emitting layer/cathode (first electrode)

(ii) Substrate/semiconductor layer (+anode)/hole injection layer/organic light-emitting layer/cathode (iii) Substrate/semiconductor layer (+anode)/organic light-emitting layer/electron injection layer/cathode (iv) Substrate/semiconductor layer (+anode)/hole injection layer/organic light-emitting layer/electron injection layer/cathode (v) Substrate/semiconductor layer (+cathode (second electrode))/organic light-emitting layer/anode (first electrode)

(vi) Substrate/semiconductor layer (+cathode)/electron injection layer/organic light-emitting layer/anode (vii) Substrate/semiconductor layer (+cathode)/organic light-emitting layer/hole injection layer/anode (viii) Substrate/semiconductor layer (+cathode)/electron injection layer/organic light-emitting layer/hole injection layer/anode Note that semiconductor layer (+anode (second electrode)), for example, means that an anode which is not opposite to a cathode is provided with a semiconductor layer.

Second Embodiment

Referring now to FIG. 12(a) to FIG. 12(d), the manufacturing method of an organic EL element which is the second embodiment according to the present invention will be described in detail.

FIG. 12(a)-(d) schematically show the organic EL element in each process (step) of the manufacturing method related to the second embodiment. In the following describes the manufacturing method of the organic EL element, and with respect to the component materials, and the like, the contents described for the first embodiment may apply.

(i) Formation of Anode (Second Electrode)

Figure 12:
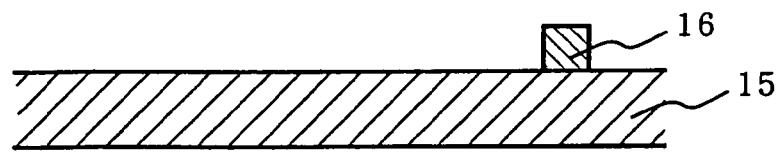
FIG. 12 is a cross-sectional view for describing a manufacturing method related to the second embodiment.
Figure 12:
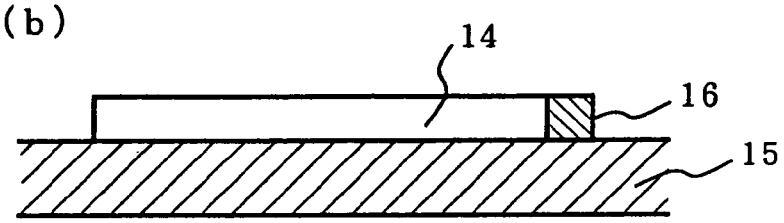
Figure 12:
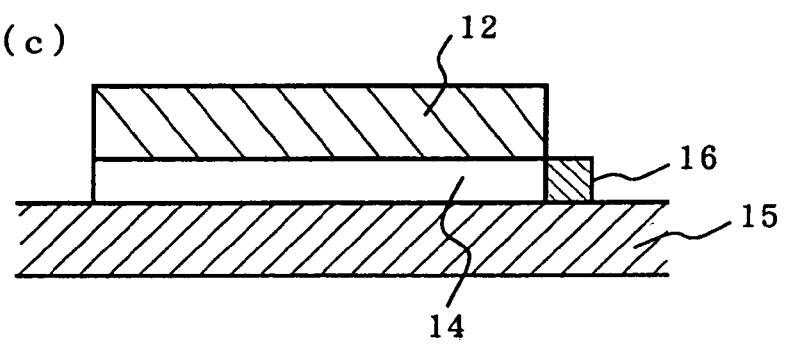
Figure 12:
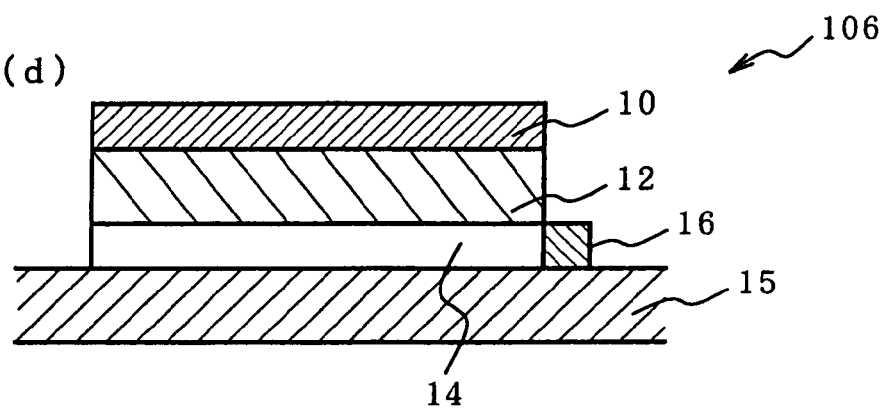
Figure 13:
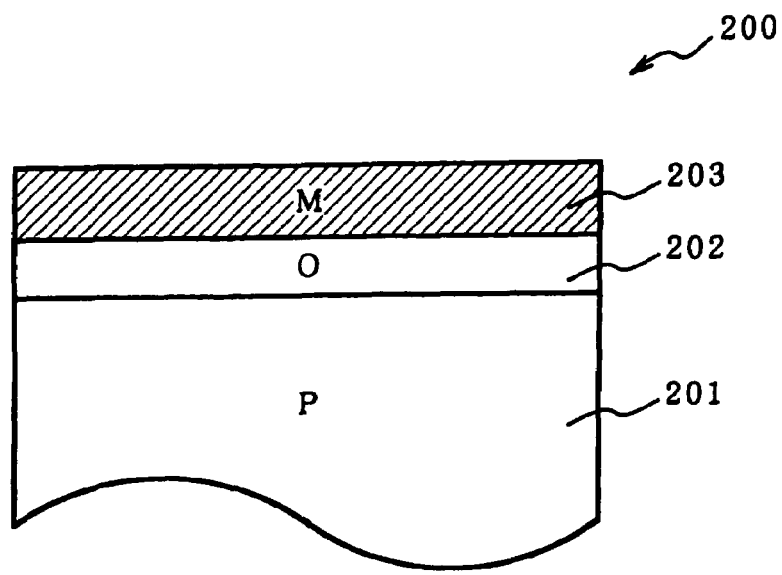
FIG. 13 is a cross-sectional view for describing the structure of a conventional organic EL element (No. 1).
Figure 14:
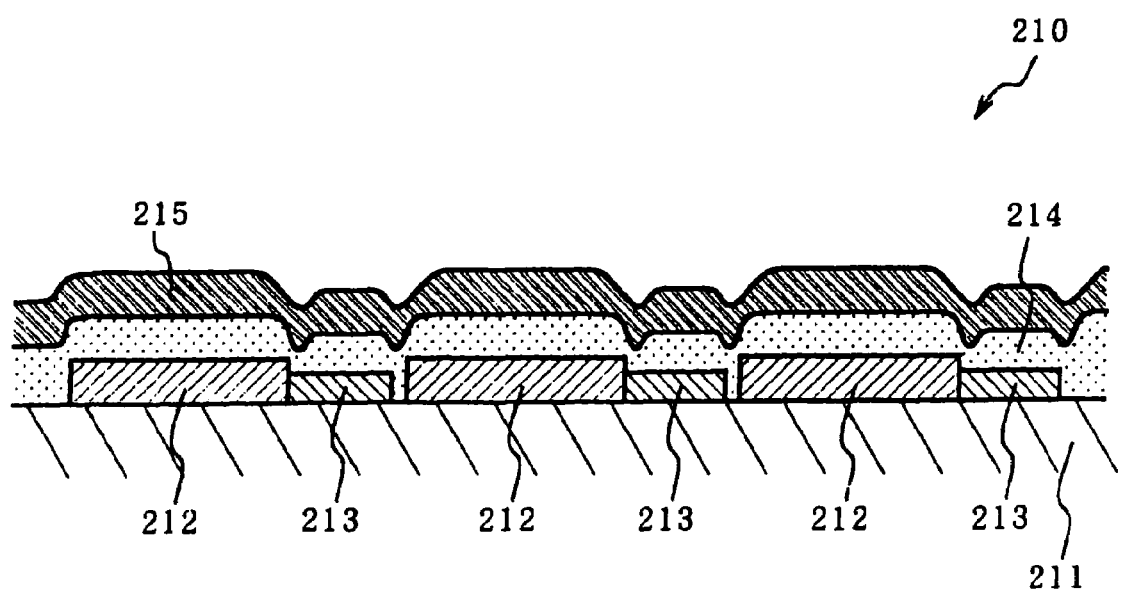
FIG. 14 is a cross-sectional view for describing the structure of a conventional organic EL element (No. 2).

FIG. 12(a) shows the condition in which the anode (second electrode) 16 is installed on the support substrate 15.

The method for forming this anode 16 is not particularly limited, but the anode may be able to be formed in the specified location by combining sputtering (deposition method) and photolithography. Specifically, on the support substrate 15, the anode layer is formed on the whole surface by the use of sputtering, and then, by using photolithography, patterns are formed and the anode 16 is accurately formed at the position which is electrically connected to the edge section 17 of the semiconductor layer 14 in the future.

It is also possible to provide a recessed section at the anode forming position on the support substrate, and to align the top portion of the support substrate to the anode surface to achieve flatness by forming the anode in the recessed section. Consequently, forming the anode in this manner enables accurate electrical connection with the edge section of the semiconductor layer when the semiconductor layer is formed in the subsequent step. In addition, forming the anode in this manner embeds the anode in the electrically insulated support substrate and can definitely maintain the electrical insulation with the organic light-emitting medium to be formed in the subsequent process step without using any electrically insulating material.

(ii) Formation of Semiconductor Layer

FIG. 12(b) shows the semiconductor layer 14 formed adjacent to the anode (second electrode) 16 on the support substrate 15. That is, the figure shows the configuration in which the semiconductor layer 14 is ready for electrical connection at the end section 17.

The method for forming this semiconductor layer 14 is not particularly limited, but for example, the semiconductor layer 14 is able to be formed at the specified location by sputtering (deposition) following the preceding process steps. That is, after etching the anode layer in the preceding procedure, the resist is separated and the semiconductor layer 14 is formed on the whole surface and patterns are provided by photolithography method, thereby forming the semiconductor layer 14 at the specified location easily and in a short time.

When the semiconductor layer 14 is formed partly overlapping with the anode 16, for example, the semiconductor layer 14 is formed with the recessed section 22 provided as shown in FIG. 3, it is also preferable to form the semiconductor layer 14 at the specified location by further using photolithography.

(iii) Formation of Organic Light-Emitting Medium

FIG. 12(c) shows the condition in which the organic light-emitting medium 12 is formed on the semiconductor layer 14. The method of forming this organic light-emitting medium is not particularly limited, but for example, the organic light-emitting medium may be formed at the specified location by the use of a shadow mask at the time of deposition. In addition, when the organic light-emitting medium 12 is composed with the light-emitting layer, hole transport layer, hole injection layer, intermediate interface layer, and the like, each layer is able to be accurately formed by repeating the deposition process each time.

In addition, when the organic light-emitting medium 12 is formed, it is preferably to coat the anode by providing the electrical insulation layer (not illustrated). By forming the electrical insulation layer in this manner, the electrical insulation between the anode and the organic light-emitting medium can be accurately secured. Consequently, occurrence of short-circuits and the cross-talking can be effectively prevented.

This kind of electrical insulation layer is preferably composed with, for example, photo-curing type epoxy resin, acrylic resin, siloxane resin, and the like. Alternatively, a non-charge injection type semiconductor layer and metallic layer can be used.

(iv) Formation of Cathode (First Electrode)

FIG. 12(d) shows the condition in which the cathode (first electrode) 10 is installed on the organic light-emitting medium 12 and the organic EL element 106 is configured. This cathode (first electrode) 10 can also be formed at the specified location by combining, for example, sputtering (deposition) and photolithography as described above.

As described above, in the second embodiment, the semiconductor layer 14 is formed after forming the anode 16, but it is also preferable to form the semiconductor layer and the anode in the procedure reversal to this. That is, by forming the semiconductor layer 14 first, and then forming the anode 16, for example, the organic EL elements 100, 102, 108 can be easily fabricated as shown in FIG. 1, FIG. 2, and FIG. 10. In addition to the case in which the second electrode is formed on the substrate, the first electrode is formed on the substrate and then the organic light-emitting medium semiconductor layer is formed; then, the second electrode may be formed at the edge section of the semiconductor layer.

EXAMPLES

Referring now to the examples, the present invention will be described further in detail as follows.

Example 1

(1) Fabrication of Organic EL Element (i) Formation of the Cathode (Second Electrode)

A transparent glass substrate having a dimension of 1.1 mm (thickness)×200 mm (length)×200 mm (width) was ultrasonically cleaned and after drying in the $N_2$ (nitrogen gas) environment, the glass substrate was cleaned by the use of UV (ultraviolet ray) and ozone further for 10 minutes. Then, on the cleaned glass substrate, a thin film (100 nm thick) comprising Al/Si alloy (Si concentration: 1 at. %) was formed by the use of the sputtering apparatus (available from ULVAC JAPAN, Ltd.). This Al/Si alloy thin film was patterned in lattices (line width: 20 µm; lattice pitch: 320 µm) by the use of photolithography as shown in FIG. 11(a). The construction of the configuration in which the cathode (second electrode) was electrically connected at the edge section of the semiconductor layer was intended.

(ii) Formation of the Semiconductor Layer

The glass substrate on which the cathode was formed was cleaned with argon plasma, and then, on this glass substrate, using the vacuum deposition apparatus (available from ULVAC JAPAN, Ltd.), ZnSe and $ZnCl_2$ with 150 nm film thickness are simultaneously deposited to form the n-type semiconductor layer. In addition, ZnSe deposition was carried out at the vacuum of $1×10^{-6}$ Torr ($1.33×10^4$ Pa) and at the temperature of 760 to 780° C., and $ZnCl_2$ deposition was carried out so that the specific resistance of the semiconductor layer satisfied $3×10^3$ Ωcm.

The charge concentration of the semiconductor layer was measured by the four-terminal method and it was confirmed that the charge concentration is $5×10^{15}$ $cm^{-3}$.

(iii) Formation of the Organic Light-Emitting Medium

Then, the following component materials were deposited successively to achieve each film thickness, and the organic light-emitting medium was formed. Alq functions as a light-emitting layer, NPD as a hole transport layer, TPD74 as a hole injection layer, and CuPc as an intermediate interface layer, respectively.

Alq (Al complex of 8-hydroxy-quinoline): 60 nm

NPD (N,N'-di-(1-naphthyl)-N,N'-diphenyl-4,4'-benzidine): 20 nm

TPD74 (4,4'-bis-(N,N-di(m-tril)amino)-4"-phenyl-triphenylamine): 20 nm

CuPu (copper phthalocyanine): 20 nm (iv) Formation of the Anode (First Electrode)

Lastly, for the anode (first electrode), Au was deposited in 20 nm film thickness and Al in 100 nm film thickness, and the organic EL element of Example 1 was obtained.

(2) Assessment of the Organic EL Element

When a DC7V voltage was applied across the anode (first electrode) and the cathode (second electrode) of the resulting organic EL element, green light emission was obtained via the semiconductor layer. Then, the current flowed at 3 mA/cm and the emission luminance at that time was 54 cd/m². Further, when the organic EL element was driven at constant current with the initial emission luminance set to 100 cd/m², a 480-hour half-life was obtained.

Example 2

(1) Formation of Organic EL Element (i) Formation of the Anode (Second Electrode)

Same as Example 1, the Al/Si alloy thin film patterned in the form of lattices (line width: 20 µm; lattice pitch: 320 µm) was formed and designated it as the anode (second electrode).

(ii) Formation of the Semiconductor Layer

The glass substrate with the anode formed was cleaned with argon plasma, and then, on this glass substrate, using the vacuum deposition apparatus (available from ULVAC JAPAN, Ltd.), CdS and Cu are simultaneously deposited in 30 nm film thickness to form the p-type semiconductor layer. The deposition was carried out at the vacuum of $1×10^{-6}$ Torr ($1.33×10^{-4}$ Pa) and at the substrate temperature of 160° C., and Cu deposition was carried out so that the specific resistance of the semiconductor layer satisfied 2×10 Ωcm. The charge concentration of the semiconductor layer was measured by the four-terminal method and it was confirmed that the charge concentration is $4×10^{17}$ $cm^{-3}$.

As described in "Applied Physics, 31, 1770 (1992)," the semiconductor layer obtained that comprised a combination of CdS and Cu was separately confirmed to provide the properties as the p-type semiconductor.

(iii) Formation of the Organic Light-Emitting Medium

Then, TPD74, NPD, and Alq used in Example 1 were deposited successively to form the organic light-emitting medium with each film thickness of 200 nm, 20 nm, and 60 nm, respectively. TPD74 functions as a hole injection layer, NPD as a hole transport layer, and Alq as a light-emitting layer, respectively.

(iv) Formation of the Cathode (First Electrode)

Lastly, for the cathode (first electrode), LiF (0.5 nm) was deposited and, then, Al was deposited in 200 nm film thickness, and the organic EL element of Example 2 was obtained.

(2) Assessment of the Organic EL Element

When DC7V voltage was applied across the cathode (first electrode) and the anode (second electrode) of the resulting organic EL element, green light emission was obtained via the semiconductor layer. Then, the 2.7 mA/cm² current flowed and the emission luminance at that time was 32 cd/m². Further, when the organic EL element was driven at constant current with the initial emission luminance set to 100 cd/m², a 620-hour half-life was obtained.

Example 3

(1) Fabrication of Organic EL Element

In Example 3, effects of the organic semiconductor layer were investigated. That is, in place of the semiconductor layer comprising a combination of CdS and Cu in Example 2, a 70-nm-film thickness semiconductor layer comprising PEDOT (3,4-polyethylene dioxythiophene, available from Bayer), which is a semiconductive polymer, was spin-coated in an aqueous solution, and then, was vacuum-dried to form an organic EL element, with others all same as Example 2.

(2) Assessment of the Organic EL Element

When DC7V voltage was applied across the cathode (first electrode) and the anode (second electrode), the 5.2 mA/cm$^2$ current flowed and green light emission which emission luminance was 180 cd/m$^2$ was obtained via the semiconductor layer. Then, when the organic EL element was driven at constant current with the initial emission luminance set to 100 cd/m$^2$, a 790-hour half-life was obtained. The results obtained are shown in Table 1.

When the surface resistance of the semiconductor layer was measured, 1.6 kΩ was obtained and the specific resistance was 1.1×10$^2$ Ωcm.

Comparative Example 1

(1) Fabrication of Organic EL Element

The organic EL element was fabricated in the same manner as Example 1, with an exception of not forming the patterned (line width: 20 μm; lattice pitch: 320 μm) Al/Si alloy thin film (cathode).

(2) Assessment of the Organic EL Element

When DC7V voltage was applied across the semiconductor layer and the anode (first electrode) in the organic EL element obtained, only a spot-like light emission about 5 mm in diameter was obtained near the place where the electricity was fed to the semiconductor layer.

That is, even when the voltage was directly applied to the semiconductor layer with resistance as high as 3×10$^3$ Ωcm without the second electrode, the light was scarcely emitted and the organic element obtained did not function as the organic EL element.

Comparative Example 2

(1) Fabrication of Organic EL Element

The organic EL element was fabricated in the same manner as Example 1, with an exception of not patterning in lattices the Al/Si alloy thin film (cathode) in Example 1 but forming the film throughout the whole surface.

(2) Assessment of the Organic EL Element

When DC7V voltage was applied across the Al/Si alloy thin film and Au/Al (cathode) in the organic EL element obtained, 3.6 mA/cm$^2$ current flowed and the light emission was 0.6 cd/m$^2$. That is, the light energy that was emitted was lowered to about 1/50 as compared to Example 1. It was assumed that when the light was emitted via the cathode formed throughout the whole surface and the semiconductor layer, EL light emission may be absorbed by the cathode and the semiconductor layer.

Consequently, the superiority of patterning the Al/Si alloy thin film (cathode) and electrically connecting to the edge section of the semiconductor layer as in the case of Example 1 was identified.

TABLE 1

| | Example 1 | Example 2 | Example 3 | Comparative example 1 | Comparative example 2 |
|---|---|---|---|---|---|
| Second electrode | Patterned cathode | Patterned anode | Patterned anode | None | Non-patterned cathode |
| Semi-conductor layer | ZnSe/ZnCl$_2$ | CdS/Cu | PEDOT | ZnSe/ZnCl$_2$ | ZnSe/ZnCl$_2$ |
| EL light emission take-out surface | Semi-conductor layer | Semi-conductor layer | Semi-conductor layer | Semi-conductor layer | Cathode/Semi-conductor layer |
| Luminance (cd/m$^2$) | 54 | 32 | 180 | Spot like emission | 0.6 |
| Half-life (hours) | 480 | 620 | 790 | 0 | 0 |

INDUSTRIAL APPLICABILITY

According to the organic EL element of the present invention, it is no longer necessary to form the first electrode and the second electrode virtually opposite to each other. This is because of an organic light emitting medium installed between the first electrode (anode or cathode) and the semiconductor layer comprising the non-monocrystal material and electrically connecting the second electrode (cathode or anode) to the edge section of the semiconductor layer. Consequently, the following effects have been able to be obtained.

(i) Because the first electrode and the second electrode are not virtually opposite to each other, the EL light emission is able to be emitted from the semiconductor layer.

Consequently, electrode materials which have been unable to be used due to the relation of light transmittance, and the like can be used, and the selection range has been remarkably increased. For example, low-resistance metallic materials have been able to be used, and consequently, low-voltage drive is enabled, and an organic EL element whose consumption power is low and response speed is high can be supplied.

In addition, even when the EL light emission is emitted from the semiconductor layer, since the second electrode is installed at the edge section of the semiconductor layer, the second electrode does not shield the light and the EL light emission has been able to be emitted efficiently.

Furthermore, the blue light emission which used to be absorbed at the semiconductor monocrystal and was difficult to emit due to the relationships of light transmittances has been able to be efficiently emitted.

(ii) Because the semiconductor layer is formed by the non-monocrystal material, a large-area semiconductor layer has been able to be formed efficiently. Consequently, by forming the organic light-emitting medium and the like on this kind of semiconductor layer, an organic EL element with uniform properties and a large area has been presented.

(iii) Because the second electrode is located in the lateral direction of the organic light-emitting medium, short-circuits of the second and the first electrodes have also been prevented. That is, because short-circuits result in display failure of the element, this kind of display failure has been able to be completely eliminated by the configuration of the present invention.

(iv) When the inorganic semiconductor material is used for the semiconductor layer, an organic EL elementcan be provided that provides superb heat resistance and durability, and is free of separation of the semiconductor layer and the second electrode even if the element is driven, for example, for more than 1000 hours, and at the same time achieves little degradation of luminance.

In addition, according to the manufacturing method of the organic EL element of the present invention, when either of the anode or the cathode is designated to the first electrode and the other electrode to the second electrode, the selectivity of order of each forming process step has become increased by including a step for the second electrode, a step for forming the semiconductor layer at the position connectable to the second electrode edge section by the use of non-monocrystal material, a step for forming the organic light-emitting medium, and a step for forming the first electrode. Because the non-monocrystal material is used for the semiconductor layer, an organic EL element which provides uniform properties and a large area are able to be easily manufactured. In addition, since there is no need to form the first electrode and the second electrode opposite to each other, the light energy emitted is able to be increased, and at the same time, a wide variety of electrode materials have been able to be used.

What is claimed is:

1. An organic electroluminescence element comprising a support substrate, a first electrode, an organic light-emitting medium, and a semiconductor layer comprising a non-monocrystal materials in this order, and a second electrode in physical contact with the semiconductor layer;

wherein the semiconductor layer is capable of transmitting light emitted from the organic light-emitting medium to permit such light to leave the organic electroluminescence element;

and wherein the second electrode is not capable of transmitting light emitted from the organic light-emitting medium.

2. The organic electroluminescence element according to claim 1 wherein the non-monocrystal material is at least one chalcogenide material selected from the group consisting of ZnS, ZnSe, CdS, CdTe, ZnTe, MgS, MgSe, ZnSSe, ZnMgSSe, ZnCdSSe, and ZnTeSe.

3. The organic electroluminescence element according to claim 1 wherein the non-monocrystal material is at least one metal oxide non-degenerate semiconductor selected from the group consisting of oxidized Al, Sn, Zn, In, Cd, Mg, and Si.

4. The organic electroluminescence element according to claim 1 wherein the non-monocrystal material is either amorphous carbon or diamond-like carbon.

5. The organic electroluminescence element according to claim 1 wherein the non-monocrystal material is a conductive conjugate polymer, an oxidizing agent added polymer, a reducing agent added polymer, an oxidizing agent added low-molecular weight compound, or a reducing agent added low-molecular weight compound.

6. The organic electroluminescence element according to claim 1 wherein the first electrode is not capable of transmitting light emitted from the organic light-emitting medium.

7. The organic electroluminescence element according to claim 1 wherein the support substrate is not capable of transmitting light emitted from the organic light-emitting medium.

* * * * *